United States Patent [19]

Gaicki

[11] 4,067,039
[45] Jan. 3, 1978

[54] ULTRASONIC BONDING HEAD

[75] Inventor: Stanley Gaicki, Tempe, Ariz.

[73] Assignee: Motorola, Inc., Schaumburg, Ill.

[21] Appl. No.: 714,728

[22] Filed: Aug. 16, 1976

Related U.S. Application Data

[63] Continuation of Ser. No. 558,745, March 17, 1975, abandoned.

[51] Int. Cl.² .................. H01L 23/48; H01L 29/40; H01L 29/44
[52] U.S. Cl. ..................................... 357/65; 357/68; 357/70; 357/71; 228/4.5; 228/1 R; 228/13; 228/18; 228/179; 228/180 A
[58] Field of Search ............... 357/65, 68, 70, 81, 357/71, 74; 228/1, 4.5, 13, 18, 45, 179, 180

[56] References Cited

U.S. PATENT DOCUMENTS

| 3,116,655 | 1/1964 | Esopi | 228/4.5 |
|---|---|---|---|
| 3,128,648 | 4/1964 | Ciagett | 228/4.5 |
| 3,128,649 | 4/1964 | Avila et al. | 228/4.5 |
| 3,190,954 | 6/1965 | Pomerantz | 357/71 |
| 3,289,452 | 12/1966 | Kollner | 228/4.5 |
| 3,347,442 | 10/1967 | Reber | 228/4.5 |
| 3,680,206 | 8/1972 | Roberts | 357/81 |
| 3,787,966 | 1/1974 | Klossika | 228/4.5 |
| 3,941,298 | 3/1976 | Nicklaus | 228/4.5 |

Primary Examiner—Andrew J. James
Attorney, Agent, or Firm—Robert D. Lott; Kenneth R. Stevens

[57] ABSTRACT

A bonding head particularly suitable for ultrasonic bonding of larger dimensioned wires to electrically conductive metallic regions for the semiconductor field comprising a stepped impact surface for simultaneously effecting an ultrasonic bond between the wire and metallic conductive regions. The lowermost stepped portion of the impact surface insures that the wire is maintained in a stationary or positively-held position with respect to the conductive regions so as to then allow both the stepped surfaces to transmit ultrasonic energy and insure scrubbing action between the elements to be bonded.

2 Claims, 5 Drawing Figures

U.S. Patent
Jan. 3, 1978
4,067,039
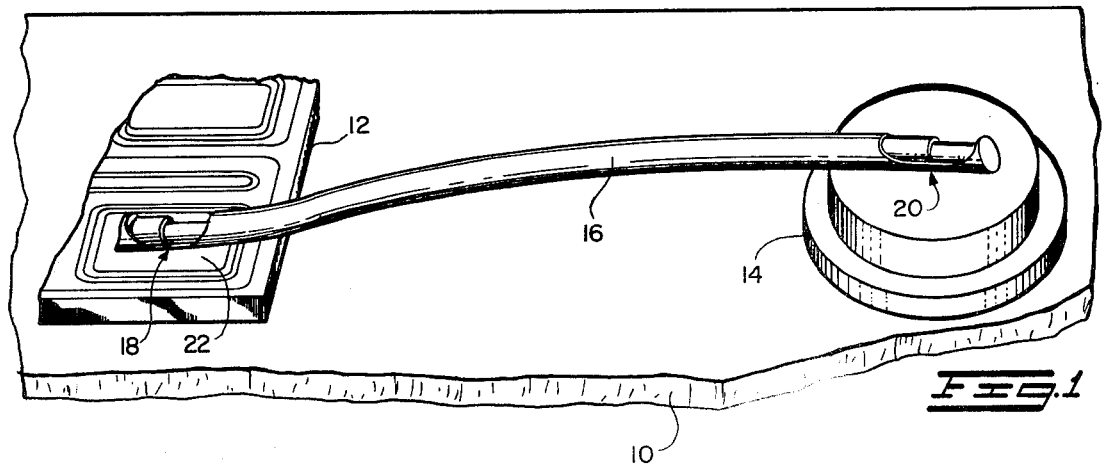
FIG. 1
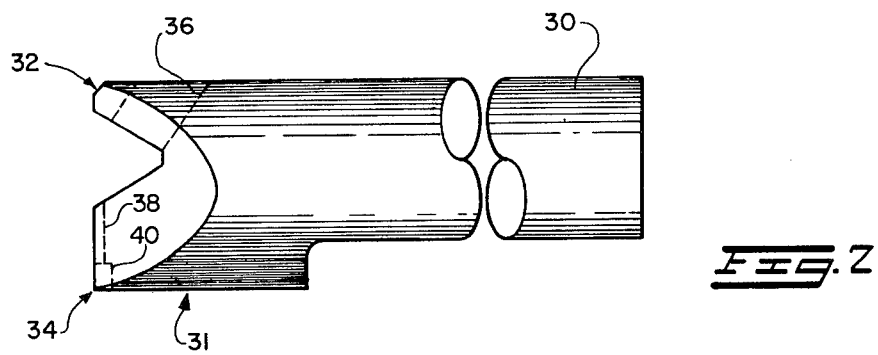
FIG. 2
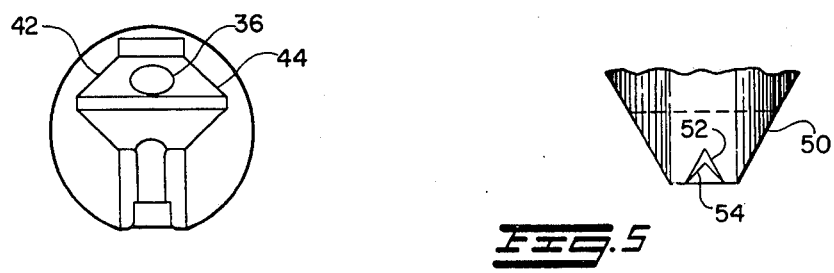
FIG. 3
FIG. 5
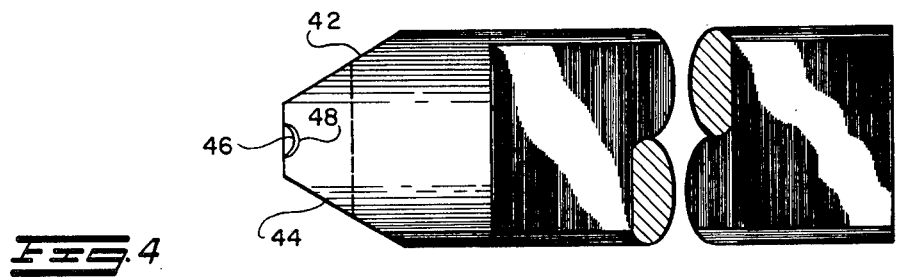
FIG. 4

ULTRASONIC BONDING HEAD

This is a continuation of application Ser. No. 558,745, filed Mar. 17, 1975, now abandoned.

BACKGROUND OF THE INVENTION

In the bonding field, particularly ultrasonic bonding, a figure of merit used to measure the efficiency of the bonding operation is sometimes characterized by power-time-weight. For smaller dimensioned wires adequate scrubbing between the wire and the bonding surface is obtained with a wide latitude in the selectability of the various factors in the figure of merit. However, in attempting to ultrasonically bond larger dimensioned wires it becomes extremely difficult to maintain the power-time-weight factors within the realm of existing equipment while still obtaining reliable ultrasonic bonds.

One solution suggested for obtaining reliable ultrasonic bonds with larger dimensioned wires using state-of-the-art bonding heads is to increase the weight or force factor associated with the bonding tool. In addition to the obvious disadvantage of increasing the weight factor for larger wires, this solution encounters additional problems in that for irregular or nonideal wire dimensions and even great amount of weight or force is required to be exerted by the bonding tool in order to insure scrubbing action.

Prior to describing the objects of the present invention it is to be emphasized that one prior art bonding tool at first glance appears to describe the present invention. That is, the prior art reference calls for a stepped bonding surface. However, upon examination it is to be realized that the stepped bonding surface is merely a compound tool wherein one surface of the step is employed for one bond operation, and then the tool is moved to another bonding site and the other step surface is singularly employed for the bonding operation. This is analogous to a two-headed hammer where one head is employed to drive one nail and the other head is employed for another nailing operation.

SUMMARY OF THE INVENTION

It is therefore an object of this invention to provide an ultrasonic bonding head having a stepped impact surface area wherein both impact surfaces are simultaneously employed to impart or transmit parallel holding and bonding forces to a larger dimensioned wire for ultrasonic bonding.

Another object of the invention is to provide an ultrasonic bonding head having a stepped impact surface wherein the impact surfaces, in a preferred embodiment, possess intersecting surfaces or surfaces capable of intersecting in order to accommodate variations in the wire dimension.

Another object of the present invention is to provide an improved ultrasonic bonding head which is capable of ultrasonically bonding larger dimension wire, for example, wires having 10 mil and upward diameters.

In accordance with the aforementioned objects, the present invention provides an ultrasonic bonding head having a stepped impact surface wherein the steps can be formed of nonintersecting or cylindrical type surfaces or of intersecting type or V-shaped surfaces in order to accommodate the tolerance variations in different sized larger dimensioned wires.

BRIEF DESCRIPTION OF THE DRAWINGS

FIG. 1 illustrates a header base having an ultrasonic wire bond between a semiconductor device or die and a conductive metal post.

FIGS. 2, 3 and 4 show various views of a die bonding head and shaft illustrating a cylindrical type stepped impact surface of the present invention.

FIG. 3 illustrates another embodiment of the present invention wherein the stepped impact surface comprises a V-shaped or stepped impact surface having intersecting sides or sides capable of intersecting.

DESCRIPTION OF THE PREFERRED EMBODIMENTS

Now referring to FIG. 1, it shows a header support base 10 for mounting a semiconductor die 12 which in the preferred embodiment is connected to a metallic post. The post 14 provides an external connection by means of a pin (not shown) connected thereto. A pair of ultrasonic bonds at the terminal portion of the wire, schematically shown at 18 and 20, provide the actual electrical connection between a metal contact or pad 22 disposed on the semiconductor die 12 and the upper surface of the post 14.

As hereinafter explained in greater detail, the ultrasonic bond at 18 and 20 produces a multilevel deformation of the terminal portions of the wire due to the configuration of the bonding head. In known prior art ultrasonic bonding equipment, a single level deformation of the wire is effected, and in most instances a fairly reliable high integrity bond is produced. Significantly, this prior art ultrasonic bonding technique was limited to small dimension wires which by way of example were in the order of two and three mils in diameter. In the present invention, it is necessary to effect a multi-level deformation of the wire in order to assure high quality reliable ultrasonic bonds for larger dimension wires. For larger dimension wires in the range of 10 mils and upwards, the existing techniques of the prior art were unable to effect high quality ultrasonic bonds.

Now referring to FIGS. 2-4, they illustrate various views of the improved ultrasonic bonding head which is capable of effecting the multilevel deformation as illustrated in FIG. 1 in order to insure high quality and reliable ultrasonic bonds. The ultrasonic energy is transmitted by means of shaft 30 to the bonding head 31 which comprises a heel portion 32 and a toe portion 34. A wire guide slot 36 allows the wire to be fed to the toe portion 34 which includes the stepped impact surface constituting a lower channel 38 and a contiguous upper channel 40. The sloping sides 42 and 44 of the bonding head are best illustrated in FIG. 4. Also, FIG. 4 illustrates that in this embodiment, the stepped impact surface of both the lower channel 38 and the upper channel 40 is comprised of cylindrical walls 46 and 48, respectively.

FIG. 5 illustrates a view similar to that depicted in FIG. 4, but in this embodiment the impact surfaces are different shaped and constituted by an upper channel surface 52 and a lower channel surface 54. The channels 52 and 54 are constituted by intersecting sides or sides capable of intersecting. That is, the surfaces are shown as intersecting in this embodiment but it is also realized that the surfaces could have been truncated at their peaks and would not actually intersect.

This embodiment may possess some advantages for certain implementations in that the V-shaped type of slot or truncated V-shaped type of slot (not shown) will grasp and secure the wire to be ultrasonically bonded even though the dimensions of the wire may vary somewhat. In other words, with the cylindrical type of impact surface there is a possibility in some applications that the wire diameters which fall below specifications will not properly contact the impact surfaces. However, with the V-shaped or nonintersecting type of sides greater design flexibility is realized in ensuring that the V-shaped type slots will properly contact and exert force on a nonuniform wire to be ultrasonically bonded.

Although the preferred embodiment has only been proven successful for ultrasonic bonding, there is no reason to expect that the bonding head would not be suitably advantageous for other bonding techniques such as thermal compression bonding.

Again, the present invention is directed to the ultrasonic bonding of larger dimensioned wires which previously were not capable of being ultrasonically bonded in a reliable manner. Wire diameters in the range of 8 to 22 mils have been successfully and reliably ultrasonically bonded using the bonding head of the present invention and, it is envisioned that diameters up to 30 mils in diameter can be successfully bonded using this approach. The lower step channel 38 insures that the wire is securely held in place during bonding in order to obtain the proper scrubbing action between the wire and the surface to which it is to be bonded, for example, the upper surface of post 14 or the metal contact 18. Both the lower and upper channels 38 and 40 effect an ultrasonic bond with the portion of the wire which it is contacting during the ultrasonic bonding operation.

What is claimed is:

1. A semiconductor structure comprising;
    a. a substrate,
    b. said substrate further including at least one first electrically conductive terminal region and a separated semiconductor chip having at least one second electrically conductive terminal region,
    c. a substantially thick wire attached between said first and second terminal regions, said wire having a diameter substantially in the range of 8-25 mils,
    d. said wire being attached at each of its ends to said first and second conductive terminal regions, respectively, by first and second metallurgical bonds,
    e. each end of said wire including a deformed portion connected to said first and second metallurgical bonds,
    f. each of said deformed portions including a stepped multilevel portion,
    g. said stepped multilevel portion including first and second surfaces located at different planes, the first stepped surface being disposed outwardly and downwardly a predetermined vertical distance from said second stepped surface by a third surface intersecting the longitudinal axis of said thick wire, the vertical distance being measured substantially perpendicular to the longitudinal axis of said thick wire and substantially the entire cross sectional dimension of said stepped multi-level portion being less than the cross-sectional dimension of said thick wire.
2. A semiconductor structure as in claim 1 wherein:
    a. each of said first and second metallurgical bonds and constituted by ultrasonic metallurgical bonds.